(12) United States Patent
Jin

(10) Patent No.: US 6,593,208 B1
(45) Date of Patent: Jul. 15, 2003

(54) METHOD OF UNIFORM POLISH IN SHALLOW TRENCH ISOLATION PROCESS

(75) Inventor: Bo Jin, Campbell, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/783,716

(22) Filed: Feb. 14, 2001

(51) Int. Cl.$^7$ ................................................ H01L 21/76
(52) U.S. Cl. ........................................................ 438/427
(58) Field of Search ............................... 438/296, 424, 438/427

(56) References Cited

U.S. PATENT DOCUMENTS

| | | | | |
|---|---|---|---|---|
| 5,817,567 A | * | 10/1998 | Jang et al. | 438/427 |
| 6,048,771 A | * | 4/2000 | Lin et al. | 438/296 |
| 6,048,775 A | * | 4/2000 | Yao et al. | 438/427 |
| 6,057,210 A | * | 5/2000 | Yang et al. | 438/427 |
| 6,071,792 A | * | 6/2000 | Kim et al. | 438/424 |
| 6,159,822 A | * | 12/2000 | Yang et al. | 438/427 |
| 6,207,533 B1 | * | 3/2001 | Gao | 438/424 |
| 6,242,322 B1 | * | 6/2001 | Chen et al. | 438/424 |

FOREIGN PATENT DOCUMENTS

JP   2000-164690   * 6/2000   .......... H01L/21/76

* cited by examiner

*Primary Examiner*—Carl Whitehead, Jr.
*Assistant Examiner*—David S Blum
(74) *Attorney, Agent, or Firm*—Sonnenschein Nath & Rosenthal

(57) ABSTRACT

A method of making a semiconductor structure includes removing a cover layer. The cover layer is on a first dielectric layer, the dielectric layer is in a trench in a substrate, and a protective layer is on the substrate. Isolation regions formed by this method have a thickness which is independent of non-uniformities resulting form chemical-mechanical polishing.

21 Claims, 4 Drawing Sheets

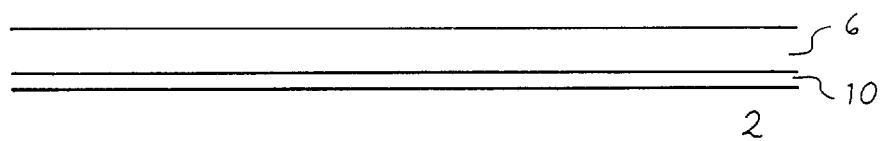
Fig. 1 CONVENTIONAL
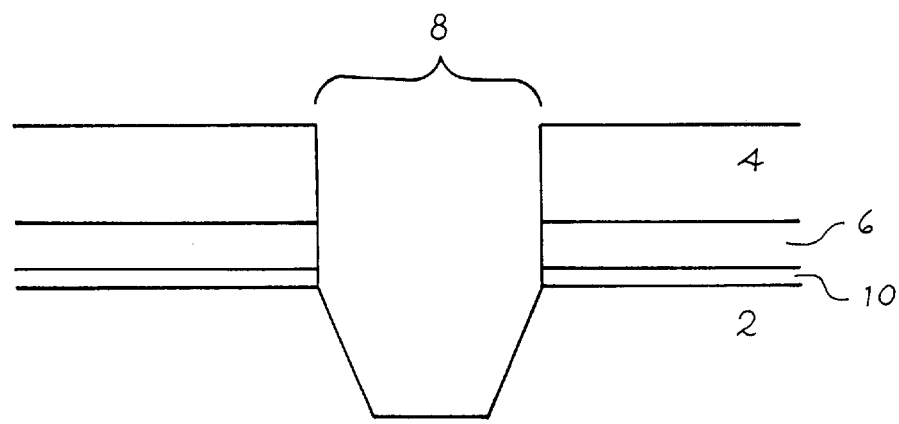
Fig. 2 CONVENTIONAL
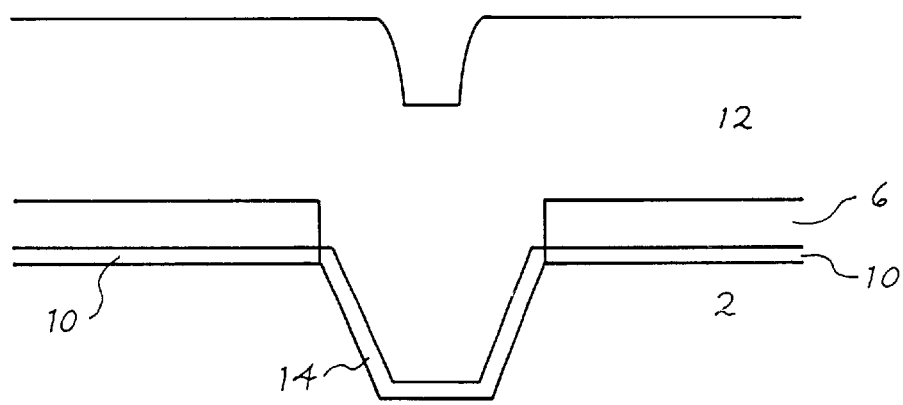
Fig. 3 CONVENTIONAL

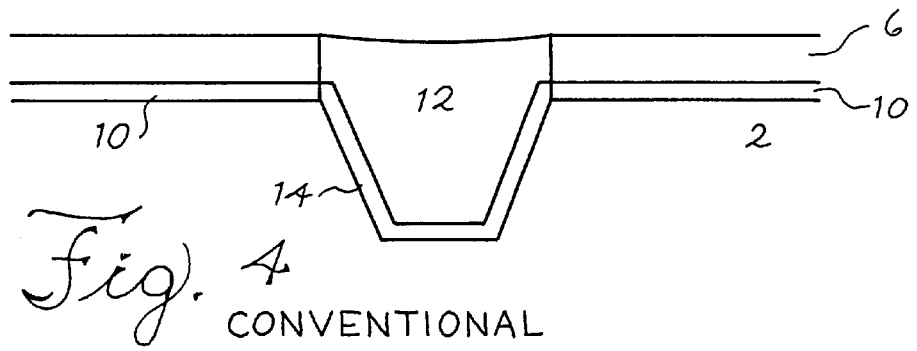
Fig. 4 CONVENTIONAL
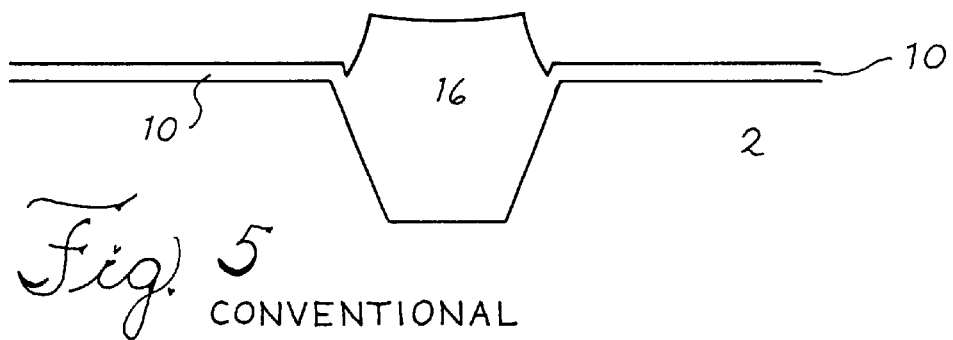
Fig. 5 CONVENTIONAL
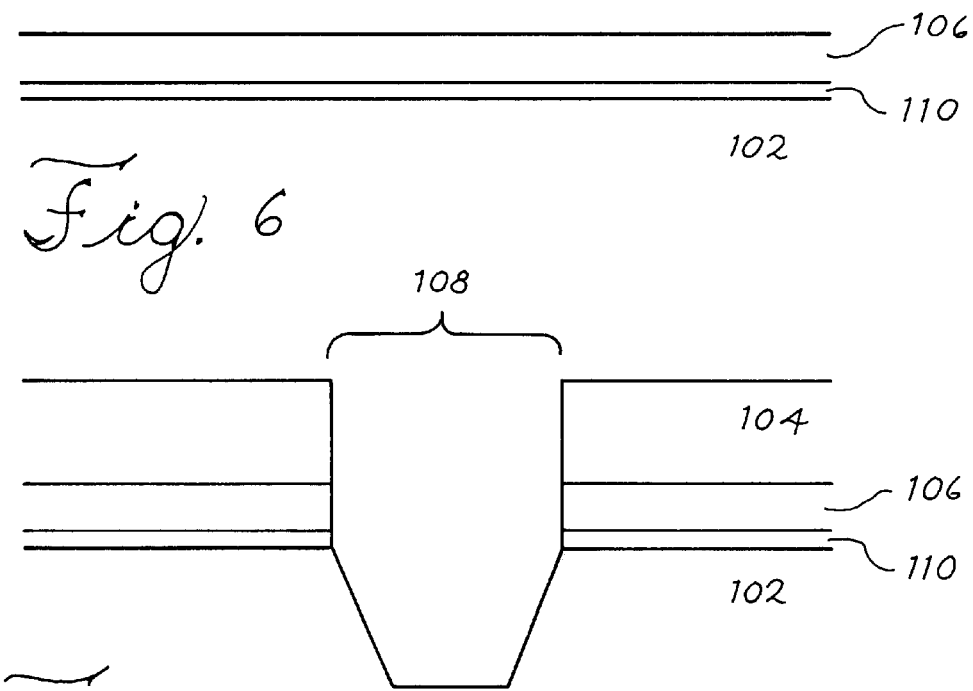
Fig. 6
Fig. 7

METHOD OF UNIFORM POLISH IN SHALLOW TRENCH ISOLATION PROCESS

BACKGROUND

The present relates to an isolation technology for semiconductor devices.

A variety of methods and structures have been used to isolate areas on semiconductor devices. One widely used isolation technique is silicon trench isolation (STI), shown in FIG. 5. The field oxide 16 in the silicon substrate 2, is continuous with a surface oxide layer 10. FIGS. 1–4 illustrate the steps used to prepare the structure shown in FIG. 5. Thermal oxidizing forms an oxide layer 10 on the silicon substrate 2, followed by depositing a silicon nitride layer 6 using low pressure chemical vapor deposition (LPCVD), to form the structure shown in FIG. 1. Next, a photoresist layer 4 is applied, and patterned using a mask. Etching of those portions of the silicon nitride, surface oxide layer and silicon substrate not covered by the photoresist layer, in a single operation, opens a trench 8, as shown in FIG. 2.

Then, the photoresist layer 4 is stripped, and the substrate is cleaned. A thin oxide layer 14 is next grown by dry oxidation of the exposed portions of the silicon substrate. An oxide layer 12 is then deposited into the trench and across the surface of the structure by chemical vapor deposition (CVD), to form the structure shown in FIG. 3. Chemical-mechanical polishing (CMP) is used to planarize the surface, leaving the oxide layer 12 only in the trench, as illustrated in FIG. 4. Finally, the silicon nitride layer is removed, to form the field oxide 16, shown in FIG. 5.

During CMP, silicon oxide regions will be polished to a thickness that is about 200–300 Å thinner than adjacent silicon nitride regions, consistently. Across the surface of the wafer, however, the CMP is not uniform: center-to-edge non-uniformity may be as great as 500–1000 Å at the silicon nitride. This is also known as step height non-uniformity. This non-uniformity remains in the oxide isolation regions after the silicon nitride is removed, and may result in reduced device yields. It would therefore be desirable to have a method of forming isolation regions having an oxide thickness that is insensitive to non-uniformities caused by CMP.

BRIEF SUMMARY

In a first aspect, the present invention is a method of making a semiconductor structure, including removing a cover layer. The cover layer is on a first dielectric layer, the dielectric layer is in a trench in a substrate, and a protective layer is on the substrate.

In a second aspect, the present invention is a method of making a semiconductor structure, including filling a trench in a silicon substrate with a first oxide layer; forming a first nitride layer on the first oxide layer; and forming a second oxide layer on the first nitride layer. A second nitride layer is on the substrate, and the first oxide layer is also between the first and second nitride layers.

In a third aspect, the present invention is a silicon wafer, having isolation regions, the isolation regions including oxide having a thickness of 1000–7000 Å in trenches in the wafer. Differences in thicknesses between isolation regions on the edge of the wafer and isolation regions in the center of the wafer are less than 500 Å.

In a fourth aspect, the present invention is a silicon wafer, having isolation regions, the isolation regions including oxide having a thickness of 1000–7000 Å in trenches in said wafer. At least 90% of the isolation regions have a thickness that varies at most 10% from the median isolation region thickness.

In a fifth aspect, the present invention is a method of making a semiconductor device from the above structures and/or wafers.

In a sixth aspect, the present invention is a method of making an electronic device from the above semiconductor device.

BRIEF DESCRIPTION OF THE DRAWINGS

Various other objects, features and attendant advantages of the present invention will be more fully appreciated as the same becomes better understood from the following detailed description when considered in connection with the accompanying drawings in which like reference characters designate like or corresponding parts throughout the several views and wherein:

FIGS. 1–4 illustrate a series of successive edge-on views for forming the structure of FIG. 5;

FIG. 5 shows an edge-on view of a portion of a semiconductor device containing field oxide formed by STI; and FIGS. 6–13 illustrate a series of successive edge-on views for an embodiment of the present invention.

DETAILED DESCRIPTION

The present invention includes forming a cover layer, preferably containing silicon nitride, after partially filling a trench with a dielectric layer preferably containing silicon oxide. This cover layer protects the underlying dielectric layer during CMP. When the cover layer is removed, the height of the underlying dielectric layer is determined by the thickness of the dielectric layer deposited into the trench, and therefore any non-uniformity generated during polishing is not translated into the isolation region.

An embodiment of the present invention is illustrated in FIGS. 6–13. A substrate dielectric layer 110 is formed on a substrate 102, followed by depositing a protective layer 106, to form the structure shown in FIG. 6. Preferably, the substrate is silicon, and the protective layer is a silicon nitride layer formed using low pressure chemical vapor deposition (LPCVD), preferably to a thickness of 50–5000 Å, more preferably 200–4000 Å, most preferably 700–2500 Å. Furthermore, the surface dielectric layer is preferably an oxide layer formed by thermally oxidizing the substrate, preferably to a thickness of 20–500 Å, more preferably 100–300 Å.

Figure 8:
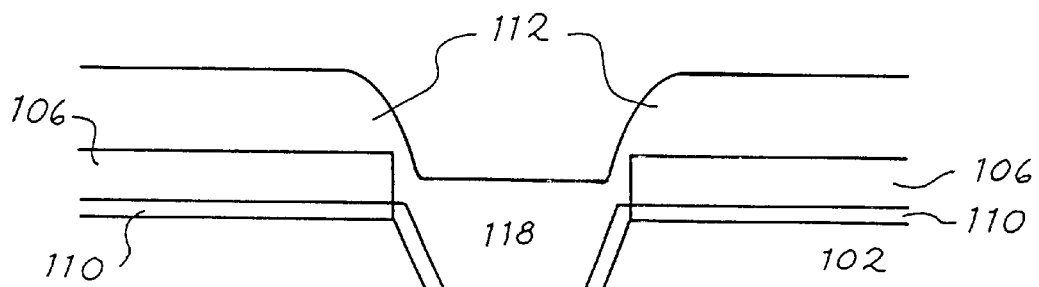

Next, a photoresist layer 104 is applied, and patterned using a mask. Etching of those portions of the protective layer, surface dielectric layer and substrate not covered by the photoresist layer, opens a trench 108, as shown in FIG. 7. Then, the photoresist layer 104 is stripped, and the substrate is cleaned. A dielectric layer 114 is next formed on the bottom surface of the trench, preferably an oxide layer formed by dry oxidation of the exposed portions of the substrate. Another dielectric layer is then formed across the structure, forming a trench dielectric 118 is the trench, and a surface dielectric 112 across the surface of the structure, as shown in FIG. 8. Preferably, the dielectric layer is silicon oxide formed by chemical vapor deposition (CVD). This layer preferably fills the trench to a level above the substrate, but below the top of the protective layer. Preferably, this dielectric layer has a thickness of 200–10,000 Å, more preferably 1000–7000 Å, most preferably 2000–5000 Å.

Figure 9:
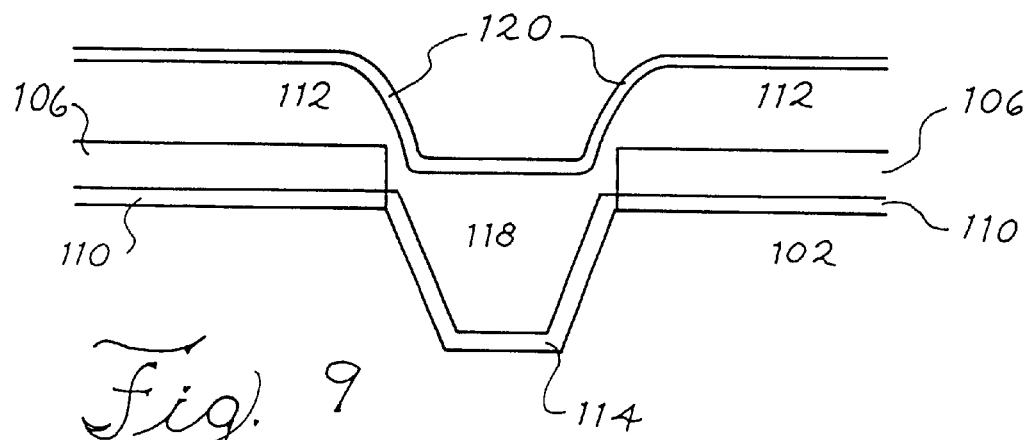
Figure 10:
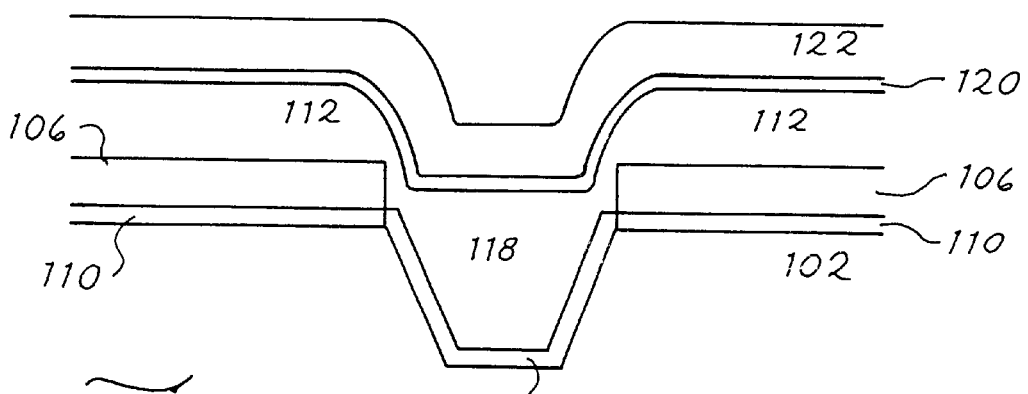

A cover layer 120, preferably of silicon nitride, is then formed across the surface of the structure, covering the trench dielectric 118 and the surface dielectric 112, forming the structure shown in FIG. 9. Preferably, the cover layer has a thickness of 20–2000 Å, more preferably 50–1000 Å, most preferably 100–500 Å, and is formed by LPCVD. Optionally, a sacrificial layer 122, preferably of silicon oxide, is formed on the cover layer, preferably to a thickness of 20–10,000 Å, more preferably 200–3000 Å, to form the structure illustrated in FIG. 10. The sacrificial layer is preferably formed by CVD.

Figure 11:
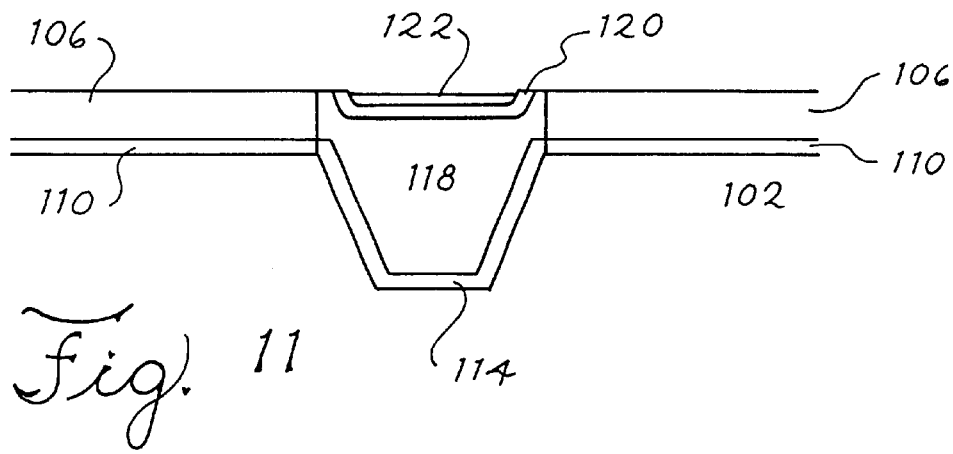
Figure 12:
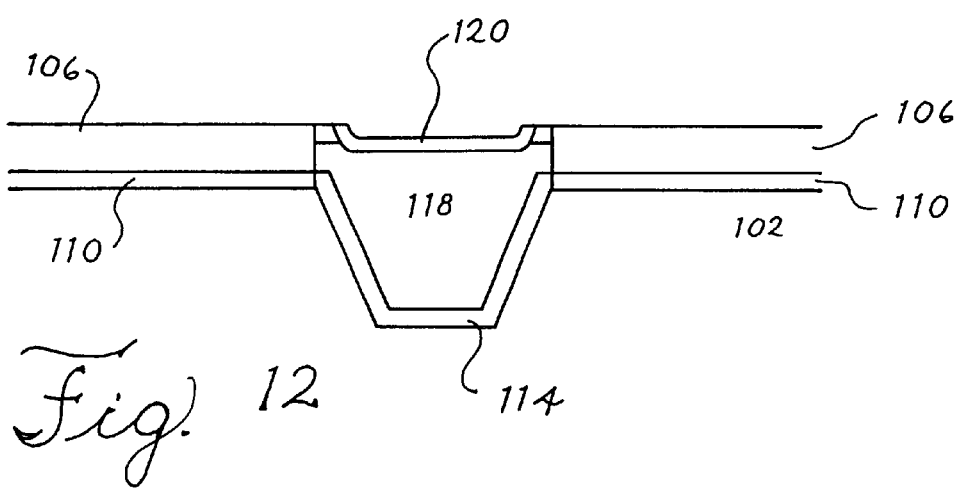

Next, the structure is polished, preferably by chemical-mechanical polishing (CMP), to planarize the surface to the level of the protective layer 106, leaving the optional sacrificial layer 122, if present, only in a shallow portion on the cover layer 120 which is on the trench dielectric 118, and removing all of the surface dielectric 112, as illustrated in FIG. 11. The optional sacrificial layer may be polished to a level that is somewhat below that of the adjacent cover layer, by about 200–300 Å, when the cover layer is silicon nitride and the sacrificial layer is silicon oxide. Small portions of the trench dielectric 118 may be exposed between the cover layer and the protective layer. Optionally, if the sacrificial layer is present, it may next be removed by selective etching. When the cover and protective layers are formed from silicon nitride, and the sacrificial layer is formed from silicon oxide, a hydrofluoric acid dip may be used to selectively etch the sacrificial layer. If the trench dielectric is also silicon oxide, it may be etched slightly, as illustrated in FIG. 12.

Figure 13:
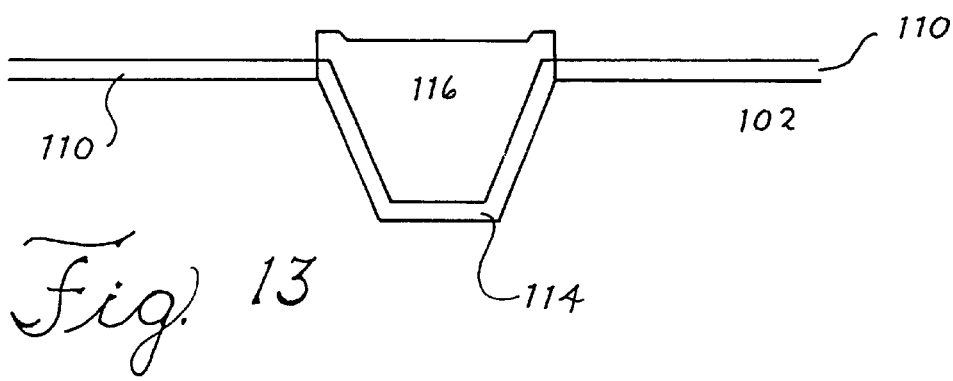

Finally, the cover and protective layers are removed, preferably by selective etching. A nitride strip, such as phosphoric acid, may be used when the cover and protective layers are silicon nitride, and the trench dielectric is silicon oxide. A trench isolation region 116 is formed, as shown in FIG. 13.

The thickness of the trench isolation region 116 is determined by the amount of dielectric deposited in the trench, rather that by any non-uniformity in the CMP. Therefore, trench isolation regions across a single wafer will have a variation in thickness that is less than that typically found in conventional field oxides regions. Preferably, the difference in thickness between isolation regions on the edge of the wafer and in the center of the wafer will be less than 1000 Å, more preferably less than 500 Å, even more preferably less than 250 Å, most preferably less than 100 Å. Preferably, at least 90% of the isolation regions will have a thickness that varies at most 10% from the median isolation region thickness; more preferably at least 95% of the isolation regions will have a thickness that varies at most 5% from the median isolation region thickness; most preferably at least 99% of the isolation regions will have a thickness that varies at most 2% from the median isolation region thickness.

The protective layer acts to protect parts of the substrate during the processing used to form the isolation region. The protective layer may be formed of any material that can protect the substrate, and that may be removed after formation of the isolation region. Preferably, the protective layer may be selectively etched with respects to the dielectric used to form the isolation region, for example dielectric materials and conductive material, including nitrides, oxides, silicides and carbides. More preferably the protective layer includes silicon nitride.

The cover layer is on the isolation region during polishing, and may be removed after polishing without removing the isolation region. The cover layer may be formed of any material that can protect the isolation region, and that may be removed after polishing. Preferably, the cover layer may be selectively etched with respects to the dielectric used to form the isolation region, for example dielectric materials and conductive material, including nitrides, oxides, suicides and carbides. More preferably the cover layer includes silicon nitride.

The sacrificial layer provides a buffer layer during polishing. The sacrificial layer may be formed of any material that can be polished and removed after polishing. Preferably, the sacrificial layer may be selectively etched with respects to the materials used to form the protective layer and the cover layer, for example dielectric materials and conductive material, including nitrides, oxides, silicides and carbides. More preferably the sacrificial layer includes silicon oxide.

Once the isolation region has been formed, semiconductor devices may be formed from the structure. For example, forming source/drain regions in the substrate, and gates and gate dielectric layers on the substrate, may be used to make transistors; these may be connected together thought dielectric layers by contacts and metallization layers. These additional elements may be formed before, during, or after formation of the isolation regions.

The individual processing steps, including etching and deposition steps, for use in the present invention are well known to those of ordinary skill in the art, and are also described in Encyclopedia of Chemical Technology, Kirk-Othmer, Volume 14, pp. 677–709 (1995); Semiconductor Device Fundamentals, Robert F. Pierret, Addison-Wesley, 1996; Wolf, Silicon Processing for the VLSI Era, Lattice Press, 1986, 1990, 1995 (vols 1–3, respectively), and Microchip Fabrication 3rd. edition, Peter Van Zant, McGraw-Hill, 1997.

The substrate may typically be a semiconductor material conventionally known by those of ordinary skill in the art. Examples include silicon, gallium arsenide, germanium, gallium nitride, aluminum phosphide, and alloys such as $Si_{1-x}Ge_x$ and $Al_xGa_{1-x}As$, where $0<x<1$. Many others are known, such as those listed in Semiconductor Device Fundamentals, on page 4, Table 1.1 (Robert F. Pierret, Addison-Wesley, 1996). Preferably, the semiconductor substrate is silicon, which may be doped or undoped.

The dielectric layers may be made from any dielectric material conventionally known to those of ordinary skill in the art. Examples include conventional oxides, nitrides, oxynitrides, and other dielectrics, such as borophosphosilicate glass (BPSG), borosilicate glass (BSG), phosphosilicate glass, spin-on glass (SOG), silicon nitride, silicon oxide, P-doped silicon oxide (P-glass), and low k dielectric materials (such as F-doped silicon oxide), for example $SiO_2$, $Si_3N_4$, $Al_2O_3$, $SiO_xN_y$, $Ta_2O_5$, $TiO_2$, etc. The term "oxide" refers to a metal oxide conventionally used to isolate electrically active structures in an integrated circuit from each other, typically an oxide of silicon and/or aluminum (e.g., $SiO_2$ or $Al_2O_3$, which may be conventionally doped with fluorine, boron, phosphorous or a mixture thereof; preferably $SiO_2$ or $SiO_2$ conventionally doped with 1–12 wt % of phosphorous and 0–8 wt % of boron). Preferably, the dielectric layers are formed from $SiO_2$ or $Si_3N_4$.

When nitride, oxide and/or other layers are removed, they may be selectively etched, in which case the layer they are on acts as the etch stop layer. Preferably, the etch selectivity (i.e., the ratio of (a) the rate of dielectric etching to (b) the rate of etch stop material etching) is at least 2:1, preferably at least 3:1, more preferably at least 5:1 and even more preferably at least 10:1. In the case of etching silicon oxide using silicon nitride as the etch-stop layer, an etching solution of one part HF(49%) in one part deionized water will give a selectivity of greater than 1:300.

The structures of the present invention may be incorporated into a semiconductor device such as an integrated circuit, for example a memory cell such as an SRAM, a DRAM, an EPROM, an EEPROM etc.; a programmable logic device; a data communications device; a clock generation device; etc. Furthermore, any of these semiconductor devices may be incorporated in an electronic device, for example a computer, an airplane or an automobile.

Obviously, numerous modifications and variations of the present invention are possible in light of the above teachings. It is therefore to be understood that within the scope of the appended claims, the invention may be practiced otherwise than as specifically described herein.

What is claimed is:

1. A method of making a semiconductor structure, comprising:
    forming a cover layer by LPCVD, to form a structure;
    polishing said structure; and
    removing said cover layer;
    wherein said cover layer is on a first dielectric layer and on a protective layer,
    said dielectric layer is in a trench in a substrate, and also between said cover layer and said protective layer,
    said protective layer is on said substrate, and
    said removing comprises etching said cover layer.

2. The method of claim 1, wherein said cover layer comprises silicon nitride, said first dielectric layer comprises an oxide, and said protective layer comprises silicon nitride.

3. The method of claim 2, wherein said first dielectric layer has a thickness of 1000–7000 Å.

4. The method of claim 2, further comprising etching said protective layer.

5. The method of claim 1, wherein said polishing is chemical-mechanical polishing.

6. A method of making a semiconductor device, comprising:
    making a semiconductor structure by the method of claim 1; and
    forming a semiconductor device from said structure.

7. A method of making an electronic device, comprising:
    making a semiconductor device by the method of claim 6; and
    forming an electronic device, comprising said semiconductor device.

8. The method of claim 1, further comprising etching said protective layer simultaneously with etching said cover layer.

9. The method of claim 1, wherein said etching of said cover layer is by selective etching.

10. A method of making a semiconductor structure, comprising:
    filling a trench in a silicon substrate with a first oxide layer;
    forming a first nitride layer on said first oxide layer;
    forming a second oxide layer on said first nitride layer; and
    removing the fist nitride layer, the removing comprising etching;
    wherein a second nitride layer is on said substrate, and said first oxide layer is also between said first and second nitride layers, and
    further comprising, prior to said removing said first nitride layer, forming said first nitride layer by LPCVD.

11. The method of claim 10, further comprising polishing away portions of said first nitride layer, first oxide layer and second oxide layer, that are on said second nitride layer.

12. The method of claim 11, wherein said polishing is chemical-mechanical polishing.

13. The method of claim 11, further comprising removing said second nitride layer.

14. The method of claim 11, wherein said first oxide layer has a thickness of 1000–7000 Å.

15. A method of making a semiconductor device, comprising:
    making a semiconductor structure by the method of claim 10; and
    forming a semiconductor device from said structure.

16. A method of making an electronic device, comprising:
    making a semiconductor device by the method of claim 15; and
    forming an electronic device, comprising said semiconductor device.

17. A method of making a semiconductor structure, comprising:
    removing a cover layer;
    wherein said cover layer is on a first dielectric layer, and dielectric layer is in a trench in a substrate, and
    a protective layer is on said substrate; and
    further comprising etching said protective layer,
    wherein said removing comprises simultaneously etching said cover layer and said protective layer; and
    further comprising, prior to said removing said cover layer, forming said cover layer by LPCVD.

18. The method of claim 11, wherein said etching of said cover layer is by selective etching.

19. A method of making a semiconductor structure, comprising:
    removing a cover layer;
    wherein said cover layer is on a first dielectric layer,
    said dielectric layer is in a trench in a substrate,
    a protective layer is on said substrate, and
    said removing comprises selectively etching said cover layer, and
    further comprising, prior to said removing said cover layer, forming said cover layer by LPCVD.

20. The method of claim 10, further comprising etching said second nitride layer simultaneously with etching said first nitride layer.

21. The method of claim 10, wherein said etching of said first nitride layer is by selective etching.

* * * * *

UNITED STATES PATENT AND TRADEMARK OFFICE
CERTIFICATE OF CORRECTION

PATENT NO.     : 6,593,208 B1
DATED          : July 15, 2003
INVENTOR(S)    : Bo Jin It is certified that error appears in the above-identified patent and that said Letters Patent is hereby corrected as shown below:

Column 6,
Line 43, delete "11" and substitute -- 17 --.

Signed and Sealed this

Ninth Day of December, 2003

JAMES E. ROGAN
*Director of the United States Patent and Trademark Office*